(12) United States Patent
Long et al.

(10) Patent No.: US 10,189,706 B2
(45) Date of Patent: Jan. 29, 2019

(54) METHOD FOR SELF-ALIGNING SOLDER-ATTACHED MEMS DIE TO A MOUNTING SURFACE

(71) Applicant: DunAn Microstaq, Inc., Austin, TX (US)

(72) Inventors: Wayne C. Long, Austin, TX (US); Joe A. Ojeda, Austin, TX (US); Gengxun K. Gurley, Hutto, TX (US); Joseph L. Nguyen, Austin, TX (US)

(73) Assignee: DunAn Microstaq, Inc., Austin, TX (US)

( * ) Notice: Subject to any disclaimer, the term of this patent is extended or adjusted under 35 U.S.C. 154(b) by 0 days.

(21) Appl. No.: 15/686,343

(22) Filed: Aug. 25, 2017

(65) Prior Publication Data

US 2018/0127269 A1 May 10, 2018

Related U.S. Application Data

(60) Provisional application No. 62/418,914, filed on Nov. 8, 2016.

(51) Int. Cl.
*B23K 31/02* (2006.01)
*B81C 1/00* (2006.01)
(Continued)

(52) U.S. Cl.
CPC ........ *B81C 1/00301* (2013.01); *B23K 1/0016* (2013.01); *B23K 35/0222* (2013.01); *B81C 3/005* (2013.01); *B23K 2101/36* (2018.08); *B81C 2203/035* (2013.01); *B81C 2203/055* (2013.01)

(58) Field of Classification Search
CPC .......... B23K 1/0016; B23K 1/20; B23K 1/19; B23K 1/0008; B23K 35/0222; B23K 35/0233–35/0244; B23K 2101/36–2101/42; B81C 1/00301; B81C 2203/035; B81C 2203/055
USPC ........ 228/214–215, 179.1–180.22, 245–255, 228/56.3

See application file for complete search history.

(56) References Cited

U.S. PATENT DOCUMENTS 4,976,813 A    12/1990  Salensky et al.
5,249,733 A *  10/1993  Brady .................. B23K 1/0016
                                                  228/180.22
(Continued)

FOREIGN PATENT DOCUMENTS

EP          0844809 A2      5/1998
JP        62-090936 A   *   4/1987
WO     WO-2006005643 A1 *   1/2006  ......... B81C 1/00269

OTHER PUBLICATIONS

Machine translation of JP-62-090936A (no date available).*

*Primary Examiner* — Kiley S Stoner
(74) *Attorney, Agent, or Firm* — MacMillan, Sobanski & Todd, LLC

(57) ABSTRACT

A method of attaching a MEMS die to a surface includes centering and rotationally aligning a solder perform on a solder surface of a body, centering and rotationally aligning a MEMS die on the solder preform, and heating the solder perform in a reflow process until the solder is molten and surface tension of the molten solder moves the MEMS die to a position where the surface tensions balance, and the MEMS die is centered on, and rotationally aligned with, the solder surface of the body.

4 Claims, 9 Drawing Sheets

(51) Int. Cl.
    *B23K 1/00*      (2006.01)
    *B23K 35/02*     (2006.01)
    *B81C 3/00*      (2006.01)
    *B23K 101/36*    (2006.01)

(56) References Cited

U.S. PATENT DOCUMENTS

| | | | | |
|---|---|---|---|---|
| 5,478,778 | A * | 12/1995 | Tanisawa | G02B 6/42 |
| | | | | 228/180.22 |
| 5,656,507 | A * | 8/1997 | Welbourn | G02B 6/4232 |
| | | | | 228/180.22 |
| 6,053,395 | A * | 4/2000 | Sasaki | G02B 6/4214 |
| | | | | 228/180.22 |
| 6,115,262 | A * | 9/2000 | Brunner | H05K 1/111 |
| | | | | 174/260 |
| 6,965,552 | B2 * | 11/2005 | Tokuda | G11B 7/127 |
| | | | | 228/180.22 |
| 7,416,106 | B1 * | 8/2008 | Downes | B23K 1/0016 |
| | | | | 228/180.21 |
| 9,140,613 | B2 | 9/2015 | Arunasalam et al. | |
| 2005/0258212 | A1 * | 11/2005 | Costello | B23K 1/0016 |
| | | | | 228/60 |
| 2006/0108678 | A1 * | 5/2006 | Kumar | B23K 35/0222 |
| | | | | 257/690 |
| 2008/0105355 | A1 * | 5/2008 | Kumar | G01R 3/00 |
| | | | | 156/60 |
| 2010/0224670 | A1 * | 9/2010 | Buchwalter | B23K 3/0638 |
| | | | | 228/102 |
| 2011/0064363 | A1 * | 3/2011 | Steijer | B23K 1/0016 |
| | | | | 385/88 |
| 2013/0001274 | A1 * | 1/2013 | Konno | H01L 23/49838 |
| | | | | 228/104 |
| 2013/0323526 | A1 * | 12/2013 | Hasin | H01L 31/18 |
| | | | | 428/599 |

\* cited by examiner

METHOD FOR SELF-ALIGNING SOLDER-ATTACHED MEMS DIE TO A MOUNTING SURFACE

BACKGROUND OF THE INVENTION

This invention relates in general to a Micro Electro Mechanical Systems (MEMS) die. In particular, this invention relates to an improved method for controlling solder flow and surface tension when attaching the MEMS die to a surface such that the MEMS die will self-align to a desired position relative to the surface while the attachment solder is molten.

A MEMS die must typically be geometrically aligned with a mounting surface for optimal wire bonding. Typically, MEMS die alignment is a function of solder flow and solder surface tension. Non-uniform solder flow and insufficient solder surface tension however, is known to cause undesirable misalignment of solder-attached MEMS dies.

According to a known method, a round solder preform is placed onto a round pedestal of a mounting body and a rectangular MEMS die is placed onto the round solder preform. Often, the MEMS die is aligned to a desired position on the pedestal by an assembler who visually positions and hand-places the MEMS die without the aid of alignment tools. According to this known method, the surface tension of the molten solder may be insufficient to maintain a desired rotational alignment of the MEMS die relative to the pedestal. Thus, it would be desirable to provide an improved method for controlling solder flow and surface tension during MEMS die attachment such that the MEMS die will self-align to a desired position relative to a surface of a mounting body while the attachment solder is molten.

SUMMARY OF THE INVENTION

This invention relates to an improved method for controlling solder flow and surface tension when attaching the MEMS die to a surface of a mounting body such that the MEMS die will self-align to a desired position relative to the surface while the attachment solder is molten.

In a first embodiment, a method of attaching a MEMS die to surface includes centering and rotationally aligning a solder perform on a solder surface of a body, centering and rotationally aligning a MEMS die on the solder preform, and heating the solder perform in a reflow process until the solder is molten and surface tension of the molten solder moves the MEMS die to a position where the surface tensions balance, and the MEMS die is centered on, and rotationally aligned with, the solder surface of the body.

A second embodiment of the method of attaching a MEMS die to a surface includes placing solder mask having a centrally formed flow area on a solder surface of a body, centering and rotationally aligning a solder perform on the solder surface of the body within the flow area of the solder mask, centering and rotationally aligning a MEMS die on the solder preform, and heating the solder perform in a reflow process until the solder is molten and surface tension of the molten solder moves the MEMS die to a position where the surface tensions balance and the MEMS die is centered within the flow area of the solder mask.

A third embodiment of the method of attaching a MEMS die to a surface includes forming a solder well in a center of a solder surface of a body, centering and rotationally aligning a solder perform within the solder well, centering and rotationally aligning a MEMS die on the solder preform, and heating the solder perform in a reflow process until the solder is molten and surface tension of the molten solder moves the MEMS die to a position where the surface tensions balance, and the MEMS die is centered within the solder well.

Various aspects of this invention will become apparent to those skilled in the art from the following detailed description of the preferred embodiments, when read in light of the accompanying drawings.

DETAILED DESCRIPTION OF THE PREFERRED EMBODIMENTS

Figure 1:
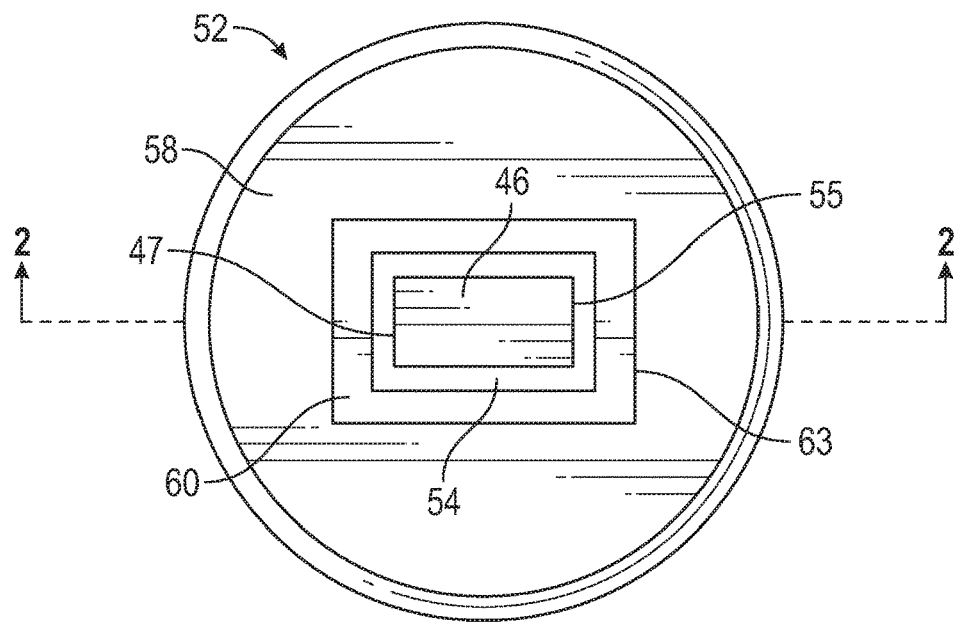
FIG. 1 is a plan view of a portion of a Superheat Controller (SHC) that has been assembled according to a first embodiment of the method of this invention.
Figure 2:
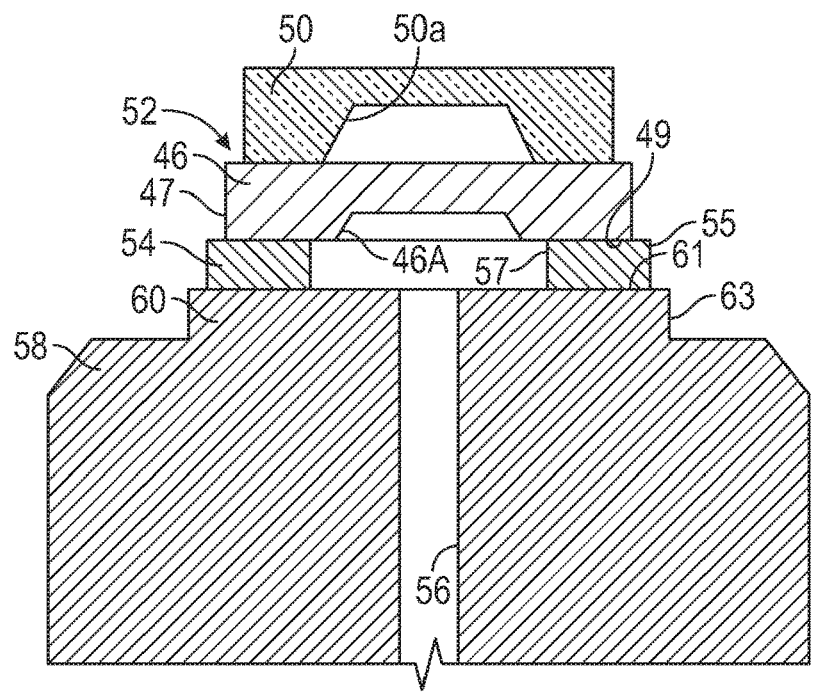
FIG. 2 is an enlarged cross-sectional elevational view taken along the line 2-2 of FIG. 1.

Referring now to the drawings, there is illustrated in FIGS. 1 and 2 a portion of a superheat controller (SHC) 52 that has been assembled according to a first embodiment of the method of this invention, described below. The SHC portion 52 includes a fluid inlet member 58 having a pedestal 60. Advantageously, the pedestal 60 has a substantially rectangular peripheral edge 63 (see FIG. 1).

As shown in FIGS. 1 and 2, the pressure sensor die 46 and its attached glass cover 50 are bonded to an outwardly facing solder surface 61 of the pedestal 60 (the upwardly facing surface when viewing FIG. 2) by a solder perform 54 having a substantially rectangular peripheral edge 55 and a hole 57 formed centrally therethrough.

Figure 3:
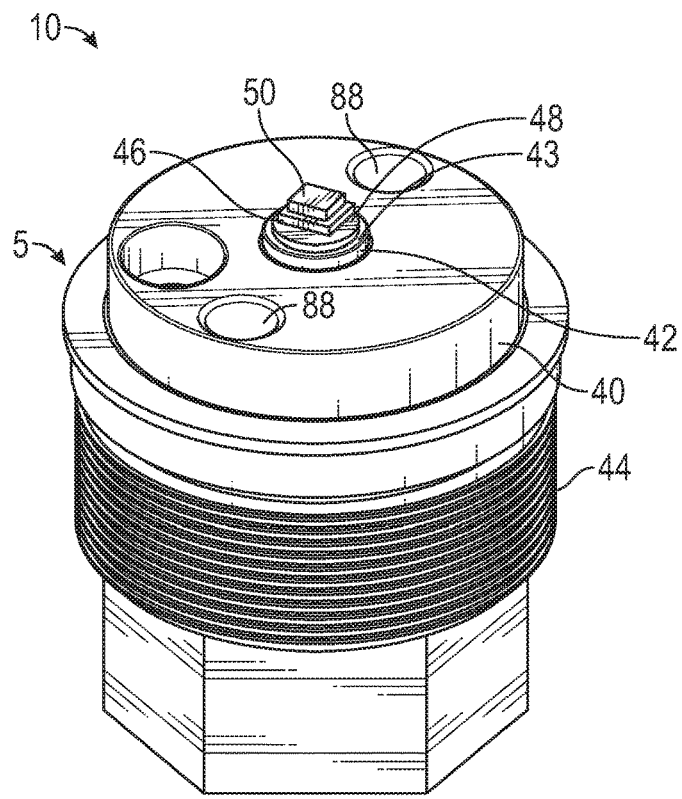
FIG. 3 is a perspective view of a portion of a known SHC.
Figure 4:
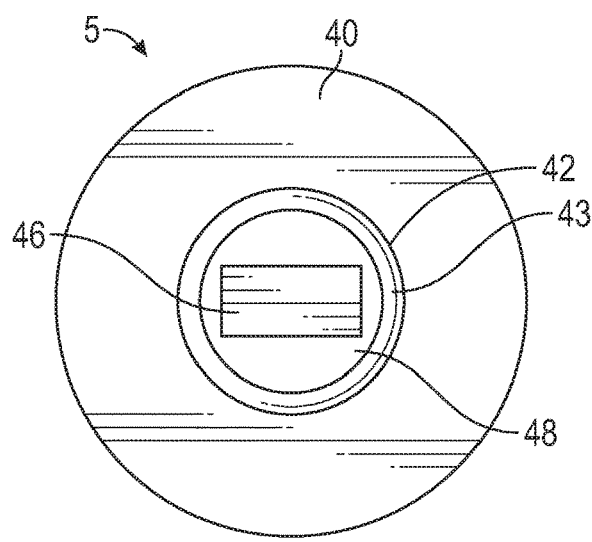
FIG. 4 is a plan view of the portion of the known SHC illustrated in FIG. 3.

Referring now to FIGS. 3 and 4, one embodiment of a portion 5 of a known SHC (not shown, but substantially similar to the SHC 10 shown in FIGS. 5 and 6) that has been assembled in a known manner is illustrated. The portion 5 of the SHC shown in FIGS. 3 and 4 includes a body or base defining a fluid inlet member 40. The fluid inlet member 40 is similar to the fluid inlet member 18 described below and includes a substantially cylindrical pedestal 42 formed on a first end of the fluid inlet member 40. The fluid inlet member 40 includes a central portion 44 that may include external threads. The illustrated fluid inlet member 40 is formed from brass. Alternatively, the fluid inlet member 40 may be formed form other metals, metal alloys, and non-metal materials.

U.S. Pat. No. 9,140,613 discloses a superheat controller (SHC). The SHC disclosed therein is a single, self-contained, stand-alone device which contains all the sensors, electronics, and intelligence to automatically detect a fluid type, such as refrigerant, and report the superheat of multiple common fluid types used in residential, industrial, and scientific applications. U.S. Pat. No. 9,140,613 is incorporated herein in its entirety.

Figure 5:
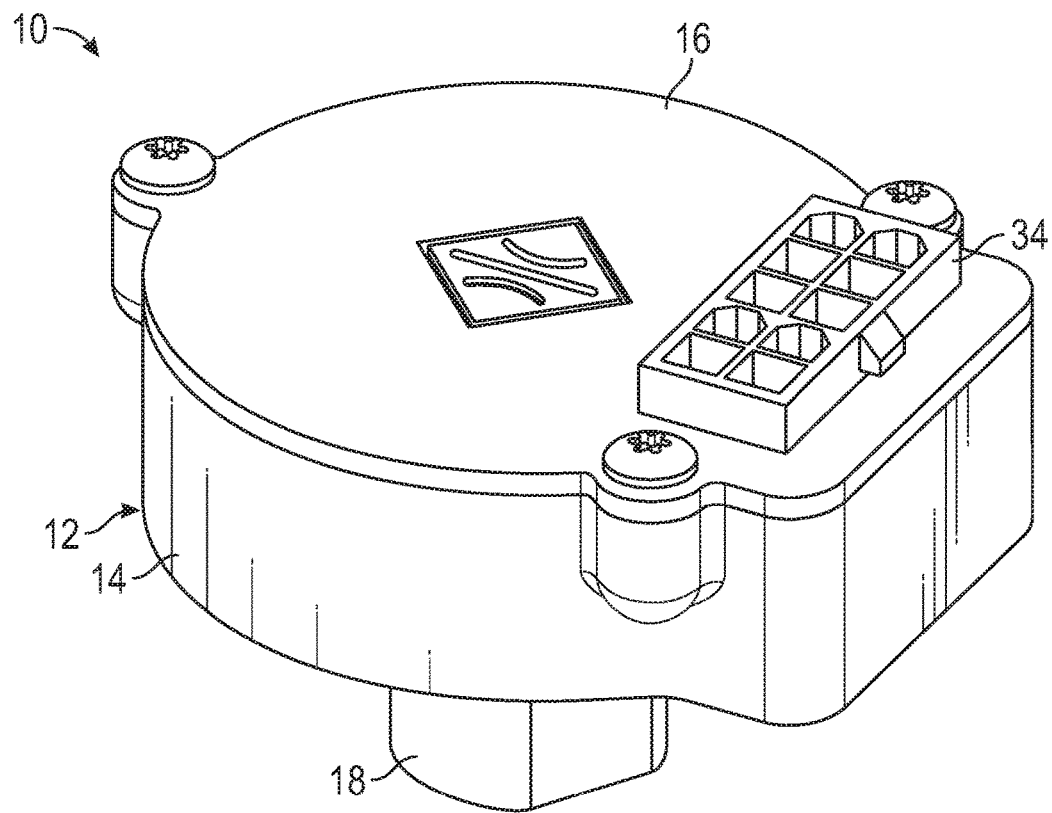
FIG. 5 is a perspective view of a known SHC.
Figure 6:
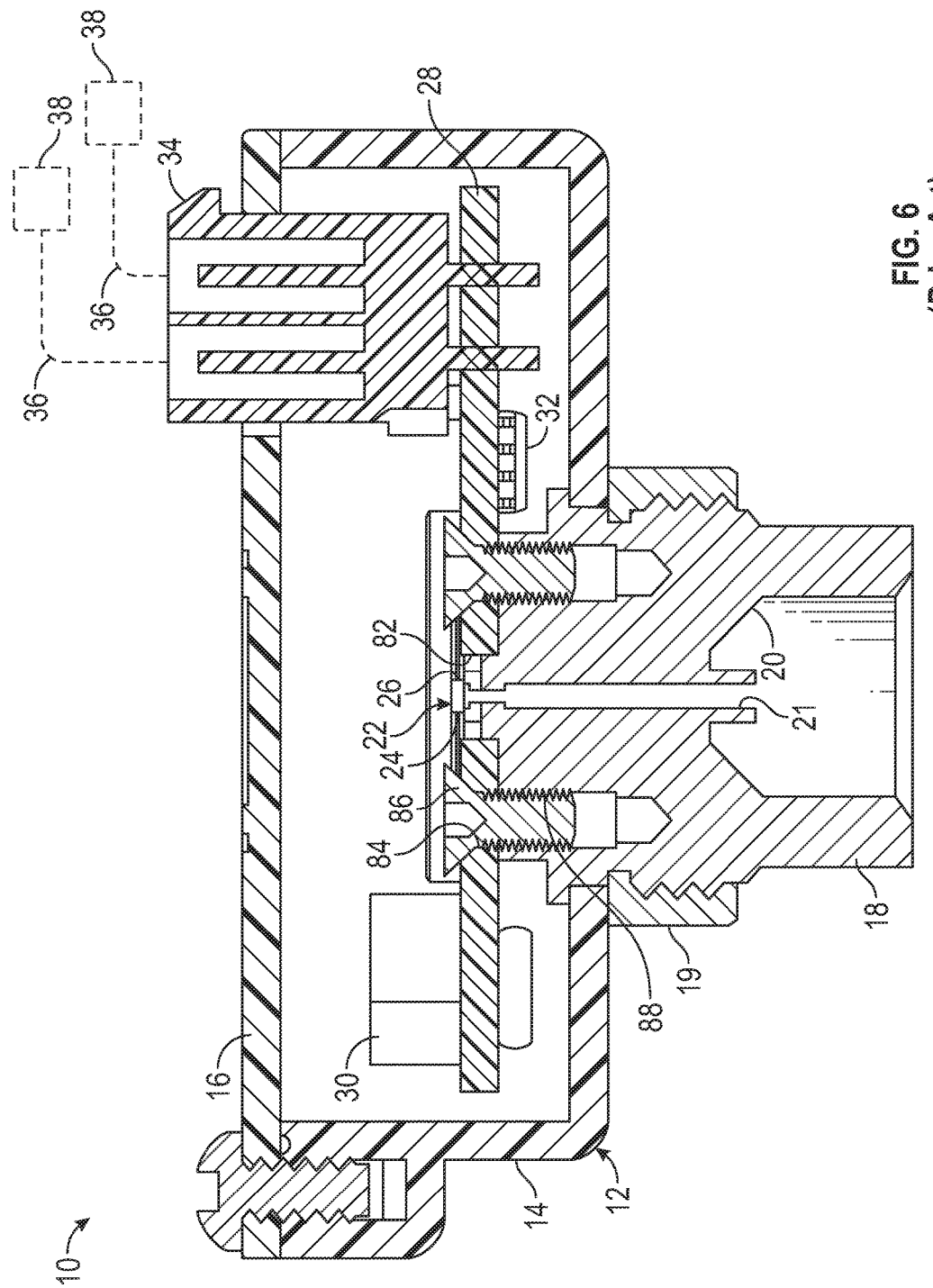
FIG. 6 is a cross sectional view of the known SHC illustrated in FIG. 5.

FIGS. 5 and 6 herein illustrate a SHC 10, which is similar to the superheat controller disclosed in U.S. Pat. No. 9,140,613. The embodiment of the SHC 10 illustrated in FIGS. 5 and 6 includes a housing 12 having a body 14, a cover 16, and the base that defines a fluid inlet member 18. The fluid inlet member 18 may be secured to the housing 12 by a mounting ring 19. The mounting ring 19 attaches the fluid inlet member 18 to the housing 12 portion by a threaded connection. Alternatively, the mounting ring 19 may be attached to the fluid inlet member 18 by any desired method, such as by welding or press fitting. In the embodiment illustrated in FIGS. 5 and 6, the fluid inlet member 18 is a brass fitting having a centrally formed opening that defines a sealing surface 20.

Figure 8:
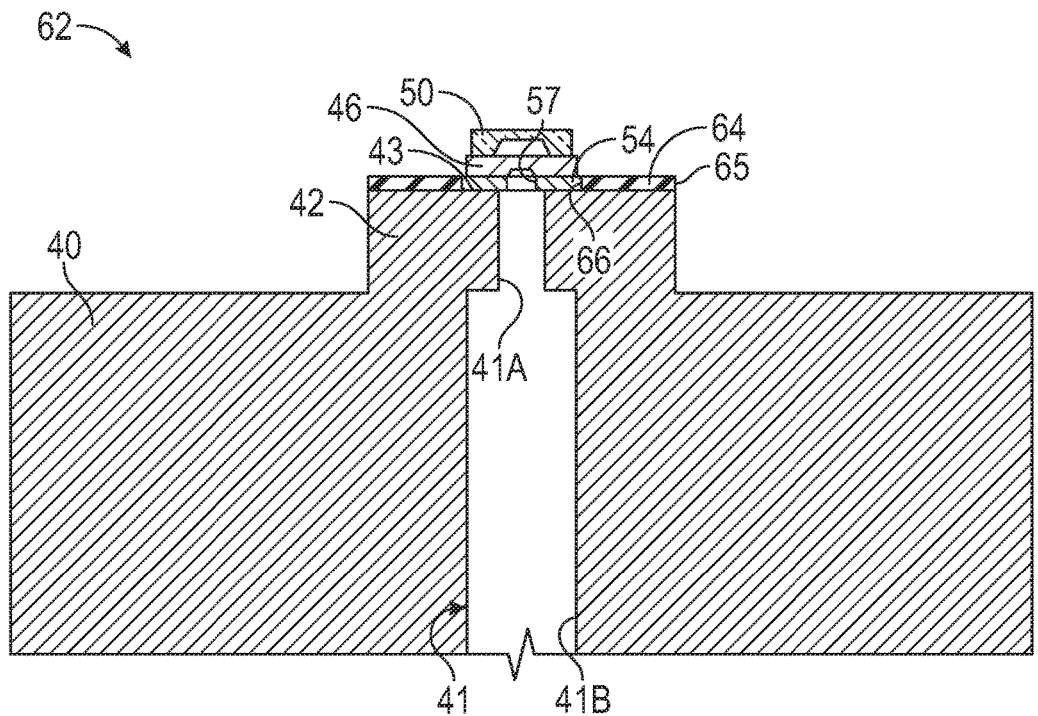
FIG. 8 is an enlarged cross sectional elevational view taken along the line 8-8 of FIG. 7.

In a known manner, a bore 41 (not shown in FIG. 3, but shown in FIG. 8) formed in the fluid inlet member 40 may convey pressurized fluid to be measured through the fluid inlet member 40, through a hermetic seal defined by the solder perform 48 (when hardened after solder reflow), and into a pressure sensing chamber 46A (see FIG. 2) of a MEMS die configured as pressure sensor die 46, described below. As shown in FIG. 8, a portion 41A of the bore 41 that extends through the pedestal 42 may have a diameter smaller than a diameter of a portion 41B of the bore 41 that extends through the rest of the fluid inlet member 40.

The SHC 10 includes an integrated pressure and temperature sensor 22 having pressure sensor portion 24 and a temperature sensor portion 26 mounted to a printed circuit board (PCB) 28. The superheat processor 30, a data-reporting or communication module 32, and an Input/Output (TO) module 34 are also mounted to the PCB 28. The IO module 34 is a physical hardware interface that accepts input power and reports data through available hard-wired interfaces, such as wires or cables 36, to the superheat processor 30. Target devices 38 that may be connected to the SHC 10 via the IO module 34 may include additional temperature sensors, laptop and notebook computers, cell phones, memory cards, and any device used in or with conventional end of the line test equipment. Alternatively, the target devices 38 may be connected to the communication module 32 by a wireless connection.

The superheat processor 30 is mounted to the PCB 28 and is a high-resolution, high accuracy device that processes the input signals from the pressure and temperature sensor portions 24 and 26, respectively, of the integrated pressure and temperature sensor 22, detects the fluid type, calculates the superheat of the fluid, and provides an output that identifies the level of the calculated superheat. The superheat processor 30 may also be configured to provide other data, such as fluid temperature, fluid pressure, fluid type, relevant historical dates maintained in an onboard memory (such as alarm and on-off history), and other desired information. Advantageously, the superheat processor 30 maintains a high level of accuracy over a typical operating range of pressure and temperature after a one-time calibration. Non-limiting examples of suitable superheat processors include microcontrollers, Field Programmable Gate Arrays (FPGAs), and Application Specific Integrated Circuits (ASICs) with embedded and/or off-board memory and peripherals.

As shown in FIGS. 3 and 4, the pressure sensor die 46 is attached to the pedestal 42 of the fluid inlet member 40 by a solder perform 48. The pressure sensor die 46 includes a glass cover 50 bonded to an outwardly facing surface thereof (the upwardly facing surface when viewing FIG. 3). The pressure sensor die 46 and its attached glass cover 50 are further bonded to an outwardly facing solder surface 43 of the pedestal 42 (the upwardly facing surface when viewing FIG. 3). A lower surface of the pressure sensor die 46 defines a bonding surface 49 (the downwardly facing surface when viewing FIG. 2). The known solder perform 48 has a substantially circular shape, and the pressure sensor die 46 may be aligned thereon by an assembler by visual positioning and hand placement, i.e., without the aid of alignment tools. Thus, according to this known method, the solder tension between the solder preform 48 (when in a molten state) and the pressure sensor die 46 is insufficient to consistently center and rotationally align the pressure sensor die 46 to a desired position relative to the pedestal 42.

Referring again to FIGS. 1 and 2, the substantially rectangular shape of the solder perform 54 advantageously guides and controls solder flow and surface tension. Additionally, the application of solder via the solder perform 54 as shown in FIGS. 1 and 2 may significantly reduce or prevent heated solder from flowing into surface ports or holes (not shown) in the pressure sensor die 46.

As shown in FIG. 2, the glass cover 50 defines a cavity 50a therein, and may be bonded to the outwardly facing surface of the pressure sensor die 46 (the upwardly facing surface when viewing FIG. 2) by any known bonding method. The glass cover 50 may be positioned over a pressure sensing chamber 46A of the pressure sensor die 46. Once bonded to the pressure sensor die 46, the cavity 50a of the glass cover 50 may be evacuated to a high vacuum so that the pressure sensor die 46 will read absolute pressure rather than a gauge pressure, i.e., the pressure difference from surrounding atmosphere. The vacuum formed in the cavity 50a may be achieved using known methods.

In the SHC portion 52 shown in FIGS. 1 and 2, the pressure sensor die 46 may be packaged to mount on a base, i.e., the fluid inlet member 40, that has at one end (see the lower end of FIG. 3) a shape similar to the core of a known Schrader valve (not shown). Therefore, a Schrader valve body (not shown) may be easily connected to a system to be monitored, such as a conventional heating, ventilating, air conditioning, and refrigeration (HVAC-R) system, but a core of the Schrader valve (not shown) may be replaced with the fluid inlet member 40 that will screw into the Schrader Valve body (not shown) in the same way the core of the Schrader Valve does. In a known manner, a bore 56 in the fluid inlet member 58 may convey pressurized fluid to be measured through the fluid inlet member 58, through a hermetic seal defined by the solder perform 54, and into a pressure sensing chamber 46A of the pressure sensor die 46.

Figure 13:
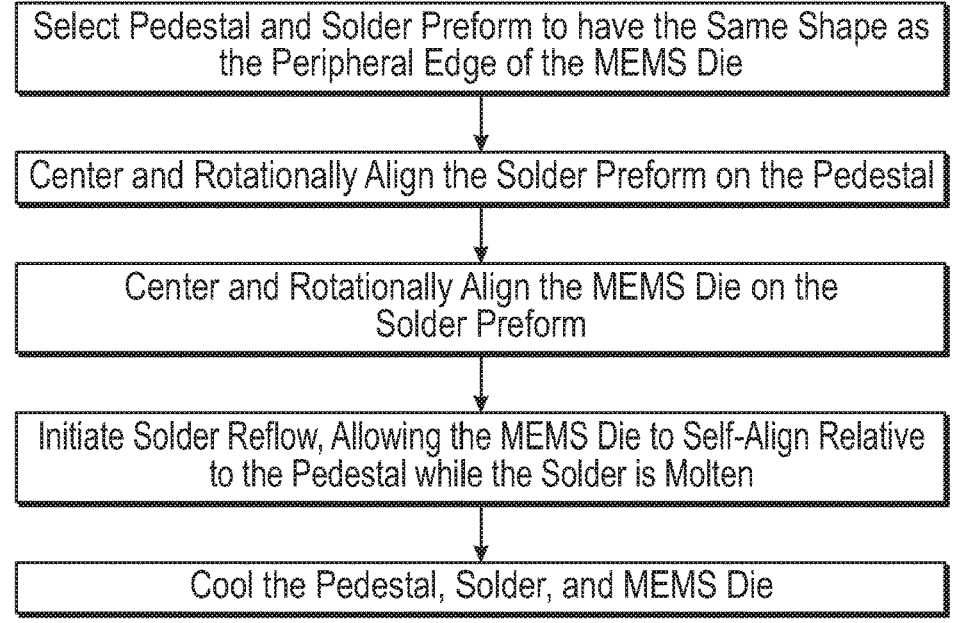
FIG. 13 is a flow chart illustrating the first embodiment of the method of this invention.

The first embodiment of the method of this invention is shown at 92 in FIG. 13 and may be performed to assemble the pressure sensor die 46 to the pedestal 60, as shown in FIGS. 1 and 2. For example, the pedestal 60 may be formed having the substantially rectangular peripheral edge 63 and the pressure sensor die 46 may be formed having the substantially rectangular peripheral edge 47. Thus, the shape of the pedestal 60 and the shape of the solder preform 54 are the same as the shape of a peripheral edge 47 of the pressure sensor die 46. An assembler may then easily center and rotationally align the substantially rectangular solder preform 54 on the substantially rectangular pedestal 60, and center and rotationally align the substantially rectangular pressure sensor die 46 on the substantially rectangular solder preform 54. The substantially rectangular pressure sensor die 46 may therefore be positioned in only one of two positions on the substantially rectangular solder preform 54.

Indicia may be added to the pressure sensor die 46 to indicate which of the two possible positions is correct. Additionally, the pressure sensor die 46, the solder preform 54, and the pedestal 60 may have any other matching shapes, so as to allow a constant width margin between the peripheral edges 47, 55, and 63, respectively, such as a square, an isosceles trapezoid, a triangle, and other desired polygonal shapes.

The fluid inlet member 58, the pressure sensor die 46, and the solder preform 54 therebetween may be heated to initiate solder reflow, thus allowing the pressure sensor die 46 to self-align relative to the pedestal 60 while the solder preform 54 is molten. The solder preform 54 may then be allowed to cool and harden.

Preferably, the peripheral edge 63 of the surface of the pedestal 60; i.e., the outer boundary of the solder-receiving surface, will be larger than a surface of the pressure sensor die 46 by a ratio determined by routine experimentation. This ratio may be optimized in a way that ensures balanced distribution and surface tension of molten solder preform 54 during reflow. In this manner, the surface tension of the molten solder will act to move the pressure sensor die 46 to a position where the surface tensions balance. This balance will occur when the pressure sensor die 46 is centered on, and rotationally aligned with, the shape of the pedestal 60 such that a constant width margin exists between the peripheral edges 47 and 63 of the pressure sensor die 46 and the pedestal 60, respectively. The fluid inlet member 58, the pressure sensor die 46, and the solder preform 54 therebetween may then be heated in a conventional manner to initiate solder reflow, thus allowing the pressure sensor die 46 to self-align relative to the pedestal 60 of the fluid inlet member 58 while the solder preform 54 is in a molten state. The heated fluid inlet member 58 and the solder preform 54 thereon may then be allowed to cool and harden.

Thus, this method controls the flow of the molten solder preform 54 and surface tension thereof during pressure sensor die 46 attachment in such a manner that an amount of self-alignment of the pressure sensor die 46 to a desired rotational position relative to the pedestal 60 will occur while the attachment solder perform 54 is molten.

It has been shown that improved bonding occurs if the solder preform 54 shape matches the shape of the pressure sensor die 46. Bonding between the pressure sensor die 46 and the pedestal 60 may be further improved when the surface areas of the solder preform 54 and the pressure sensor die 46 are equal or substantially equal. For example, the use of the substantially rectangular solder preform 54 on the substantially rectangular pedestal 60, and the substantially rectangular pressure sensor die 46 on the substantially rectangular solder preform 54 may minimize the distance that molten solder will have to flow until solder surface tension centers and rotationally aligns the pressure sensor die 46 relative to the pedestal 60. However, it will be understood that a non-rectangular solder preform 54 may work just as well with a similarly shaped non-rectangular pedestal 60.

Figure 7:
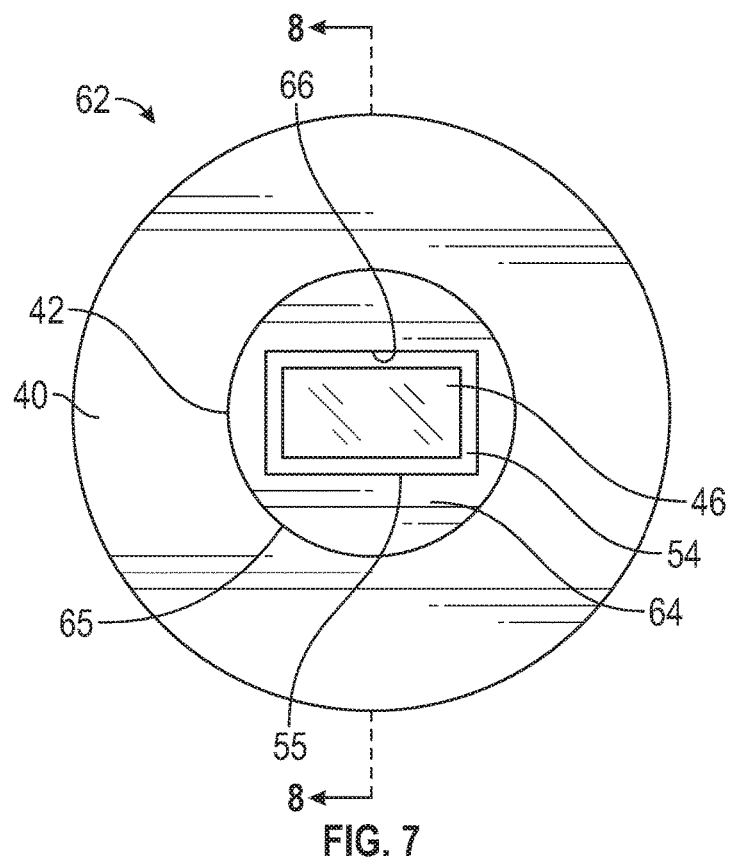
FIG. 7 is a plan view of a portion of an SHC that has been assembled according to a second embodiment of the method of this invention.
Figure 14:
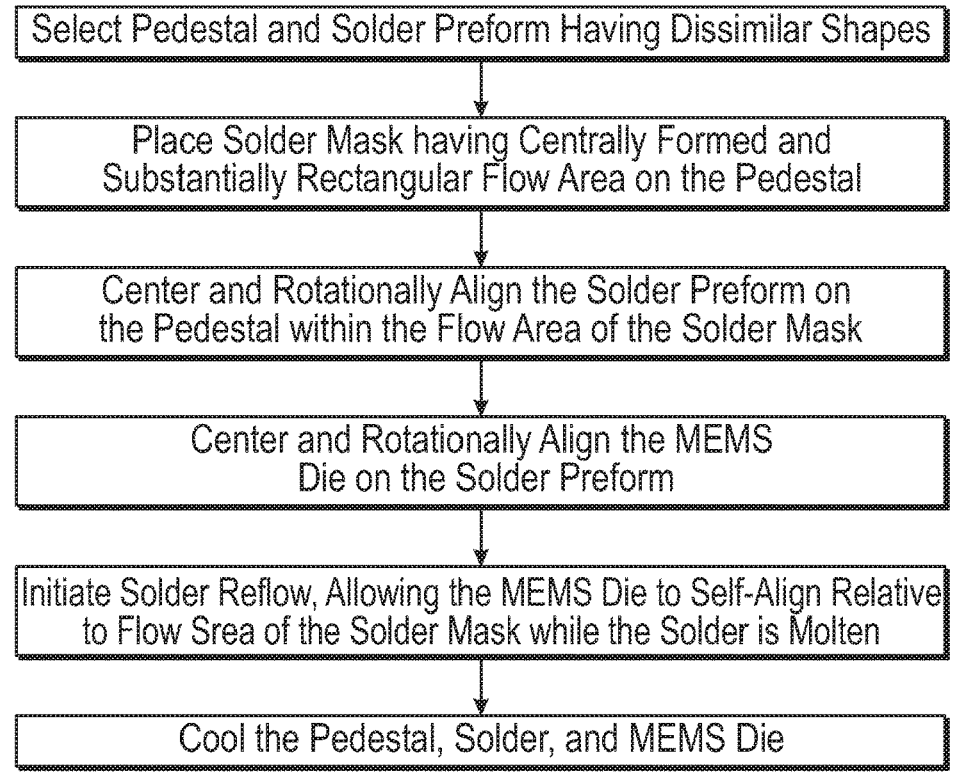
FIG. 14 is a flow chart illustrating the second embodiment of the method of this invention.

Referring now to FIGS. 7 and 8, there is illustrated at 62 a portion of an SHC that has been assembled according to a second embodiment of the method of this invention (see FIG. 14). The SHC portion 62 includes the fluid inlet member 40 having the substantially cylindrical pedestal 42, i.e., having a substantially circular cross-sectional shape. As shown in FIGS. 7 and 8, the pressure sensor die 46 and its attached glass cover 50 (not shown in FIG. 7) are bonded to the solder surface 43 of the pedestal 42 by the solder perform 54 having the substantially rectangular peripheral edge 55 and the hole 57 formed centrally therethrough.

In the second embodiment of the method, a solder mask 64 may be used to guide and control solder flow and surface tension. The illustrated solder mask 64 (also known as solder resist) may be a thin coating of a material to which liquid solder will not bond. The solder mask 64 has a substantially circular peripheral edge 65 and a diameter substantially equal to an outside diameter of the pedestal 42. A substantially rectangular flow area 66 may be formed in a center of the solder mask 64. As described above, the solder perform 54 has the substantially rectangular peripheral edge 55 and may be positioned in the flow area 66 between the pedestal 42 and the pressure sensor die 46.

By placing the solder mask 64 on the pedestal 42 in an area where solder is not desired, the flow area 66 defines an area in which molten solder from the solder preform 54 will be confined and where solder is desired to bond with the pedestal 42. Within the flow area 66, the flow and surface tension of the molten solder will act to center and rotationally align the pressure sensor die 46 to a desired orientation relative to the flow area 66, and thus relative to the pedestal 42.

The second embodiment of the method of this invention is shown at 94 in FIG. 14. In a first step of the second embodiment of the method 94, a thin layer of the solder mask 64 may be applied to a surface of the pedestal 42. The solder mask 64 may have any desired thickness, such as within about 5 µm to about 15 µm. The shape of the flow area 66 of the solder mask 64 mask may be formed or selected to be substantially the same as the shape of the peripheral edge 44 of the pressure sensor die 46. The solder mask 64 may be positioned in a desired location and rotational alignment relative to the pedestal 42.

Preferably, the flow area 66 of the solder mask 64 will be larger than a surface of the pressure sensor die 46, and a surface of the solder preform 54, by a predetermined ratio, wherein the surface of the pressure sensor die 46 may be defined by the peripheral edge 47 thereof. This ratio of the size and depth of the flow area 66 to the peripheral edge 55 and thickness of the solder preform 54, and the size of the portion 41A of the bore 41 in the pedestal 42 may be optimized in a way that ensures balanced distribution and surface tension of the molten solder preform 54 during reflow. In this manner, the surface tension of the molten solder will act to move the pressure sensor die 46 to a position where the surface tensions balance. This balance will occur when the pressure sensor die 46 is centered on, and rotationally aligned with, the shape of the flow area 66 of the solder mask 64 such that a constant width margin exists between the peripheral edge of the pressure sensor die 46 and the peripheral edge of the flow area 66. Thus, this arrangement controls solder flow and surface tension during pressure sensor die 46 attachment in such a manner that an amount of pressure sensor die 46 self-alignment to a desired position relative to the pedestal 42 will occur while the attachment solder perform 54 is molten.

Preferably, the shape of the solder preform 54 should match the shape of the flow area 66 (but not necessarily the dimensions of the flow area 66). For example, in addition to the embodiment shown in FIGS. 7 and 8, a non-rectangular solder preform (not shown) may perform just as well within a properly optimized flow area 66 in the solder mask 64.

Figure 9:
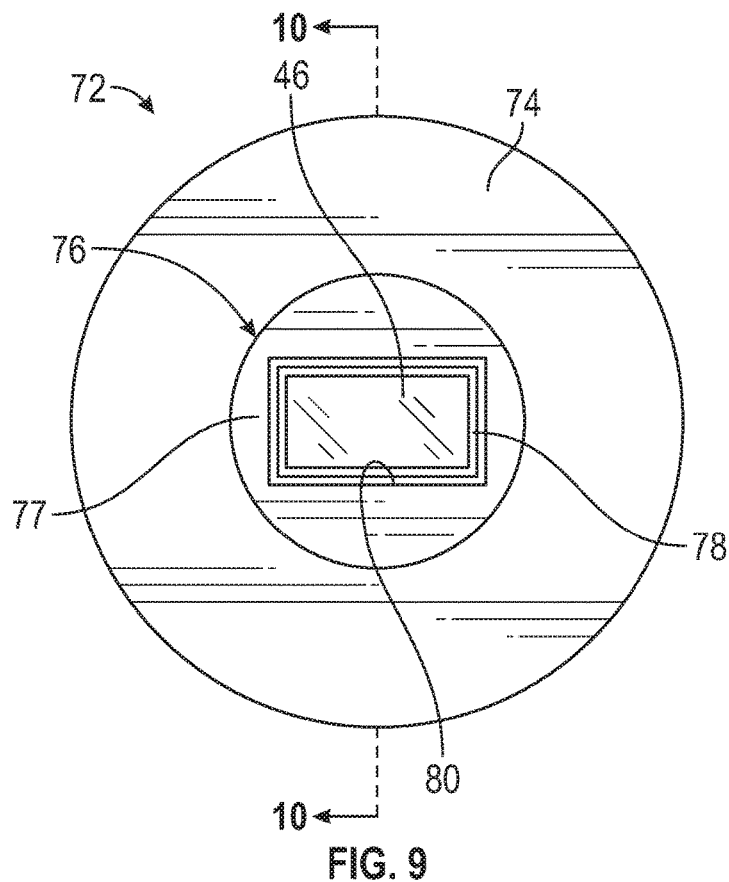
FIG. 9 is a plan view of a portion of an SHC that has been assembled according to a third embodiment of the method of this invention.
Figure 10:
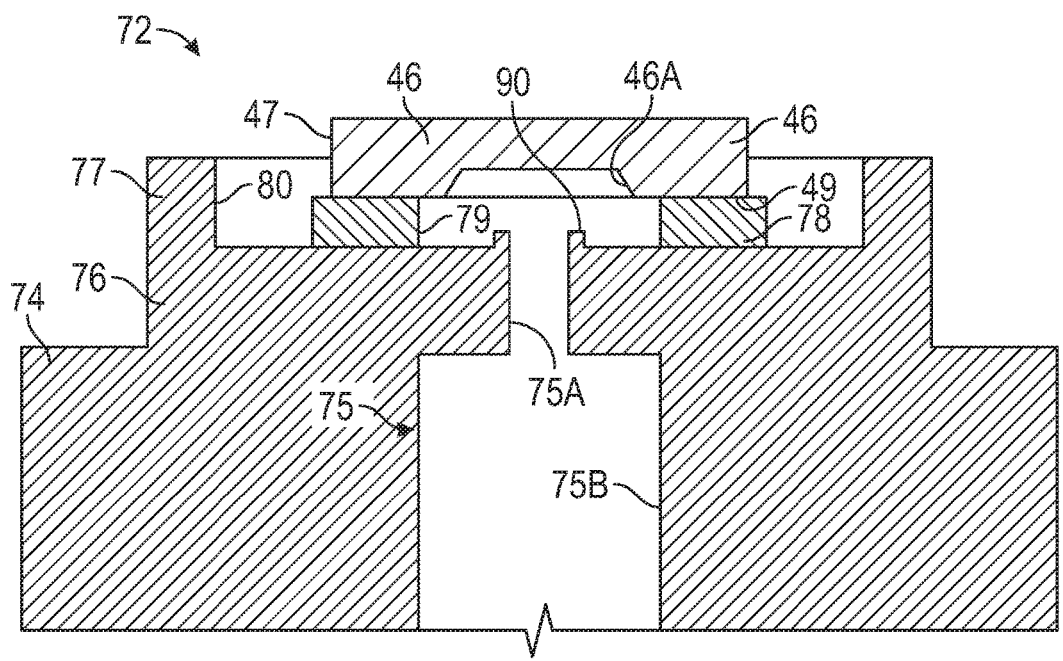
FIG. 10 is an enlarged cross sectional elevational view taken along the line 10-10 of FIG. 9.
Figure 11:
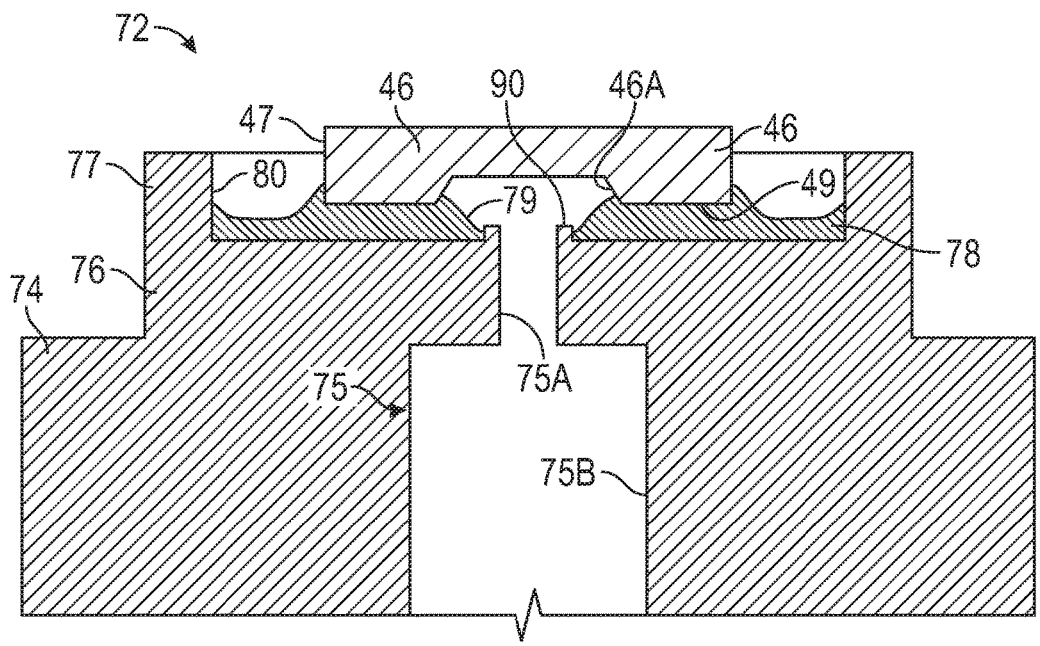
FIG. 11 is an enlarged cross-sectional elevational view of the portion of the SHC illustrated in FIGS. 9 and 10 showing the solder solidified after the perform has been heated and subsequently cooled.
Figure 15:
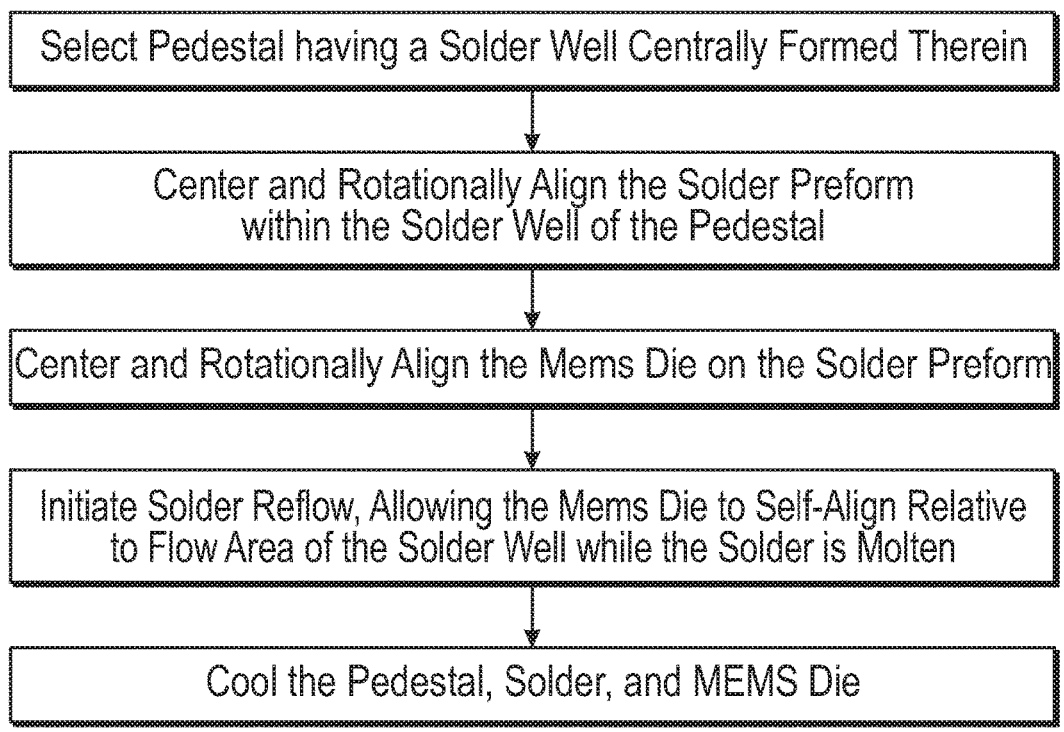
FIG. 15 is a flow chart illustrating the third embodiment of the method of this invention.

Referring now to FIGS. 9 through 11, there is illustrated at 72 a portion of an SHC that has been assembled according to a third embodiment of the method of this invention (see FIG. 15). The SHC portion 72 includes a fluid inlet member 74 having a substantially cylindrical pedestal 76. As shown in FIGS. 9 through 11, the pressure sensor die 46 and its attached glass cover 50 (not shown in FIGS. 9 through 11) are bonded to an outwardly facing surface of the pedestal 76 (upwardly facing surface when viewing FIGS. 10 and 11) by a solder perform 78 having a substantially rectangular peripheral edge and a center-hole 79 (shown in FIGS. 10 and 11) formed centrally therethrough.

In a known manner, a bore 75 formed in the fluid inlet member 74 may convey pressurized fluid to be measured through the fluid inlet member 74, through a hermetic seal defined by the solder perform 78, and into the pressure sensing chamber 46A of the pressure sensor die 46. As shown in FIGS. 10 and 11, a portion 75A of the bore 75 that extends through the pedestal 76 may have a diameter smaller than a diameter of a portion 75B of the bore 75 that extends through the rest of the fluid inlet member 74.

A shallow solder well 80 is formed centrally in the pedestal 76. The portion of the pedestal surrounding the solder well 80 defines a circumferentially and outwardly extending wall 77 (upwardly extending when viewing FIGS. 10 and 11). The solder well 80 is configured to guide and control solder flow and surface tension. The illustrated solder well 80 has a substantially rectangular shape. Alternatively, the solder well 80 may have any desired shape, such as a shape corresponding to the shape of the peripheral edge of the die used, such as for example the pressure sensor die 46. The solder well 80 may have any desired depth, such as within about 0.1 mm to about 0.35 mm. It will be understood that the depth of the solder well 80 may vary based on a height of the pressure sensor die 46, the preform volume, and the structure of the bonding surface 49 thereof.

The third embodiment of the method of this invention is shown at 96 in FIG. 15. In a first step of the third embodiment of the method 96, the shallow solder well 80 may be formed centrally in the pedestal 76 and preferably has a shape corresponding to a shape of a peripheral edge of the pressure sensor die 46. The solder well 80 may be formed such that it is positioned in a desired location and rotational alignment relative to the pedestal 76. The solder perform 78 may be positioned on a surface of the solder well 80.

Preferably, the solder well 80 will be larger than the bonding surface 49 of the pressure sensor die 46 by a predetermined ratio, wherein the surface of the pressure sensor die 46 may be defined by the peripheral edge thereof. This ratio of the size and depth of the solder well 80 to the peripheral edge, thickness, and center-hole size of the solder preform 78 may be optimized in a way that ensures balanced distribution and surface tension of molten solder during reflow. In this manner, the surface tension of the molten solder will act between an outer wall of the solder well 80 and the peripheral edge of the pressure sensor die 46 to move the pressure sensor die 46 to a position where the surface tensions balance. This balance will occur when the pressure sensor die 46 is centered in, and rotationally aligned with, the shape of the solder well 80 such that a constant width margin exists between the peripheral edge of the pressure sensor die 46 and the peripheral edge; i.e., the outer walls, of the solder well 80. Thus, this arrangement controls solder flow and surface tension during pressure sensor die 46 attachment in such a manner that an amount of pressure sensor die 46 self-alignment to a desired position relative to the pedestal 76 will occur while the attachment solder 78 is molten.

Preferably, the shape of the solder preform 78 should match the shape of the pressure sensor die 46 (but not necessarily the peripheral edge dimensions of the pressure sensor die 46). For example, in addition to the embodiment shown in FIG. 9, a non-rectangular solder preform (not shown) may perform just as well with a properly optimized solder well 80.

It will be understood that during assembly of the SHC portion 72, molten solder 78 may flow into the bore 75 from the solder well 80. There may be several ways to prevent this undesirable flow of solder 78. First, the pressure sensing chamber 46A in the pressure sensor die 46 may be larger in size than a diameter of the bore 75 formed through the pedestal 76. It has been shown that when the solder preform 78 has an annular shape and melts in the solder well 80, careful distribution of a solder flux (not shown) applied to the bonding surface on the bottom of the pressure sensor die 46 (but not in the pressure sensing chamber 46A in the bottom of the pressure sensor die 46), will cause molten solder 78 to be preferentially attracted to the bonding surface on the bottom of the pressure sensor die 46. Surface tension of the solder 78 will then keep the molten solder 78 from flowing into the area under the pressure sensing chamber 46A in the pressure sensor die 46, such that molten solder 78 will not reach the bore 75.

Alternatively, careful control of the shape and size of the solder preform 78 may be adequate to prevent molten solder from reaching the bore 75. For example, by providing a very thin solder preform 78 that extends from the walls of the solder well 80 to a position underneath some or all of the bonding surface on the bottom of the pressure sensor die 46, but not further radially inwardly, such as beneath the pressure sensing chamber 46A, advantageously results in insufficient solder volume for significant portions of the solder to reach the bore 75 after the solder melts.

Additionally, a raised lip 90 may be formed circumferentially around the bore 75, over which the molten solder will not flow, thus preventing the solder from flowing into the bore 75 (see FIGS. 10 and 11). As shown in FIGS. 10 and 11, the raised lip 90 may be formed such that it extends outwardly (upwardly when viewing FIGS. 10 and 11) from the pedestal 76 and into the pressure sensing chamber 46A in the pressure sensor die 46 to prevent solder from flowing into the bore 75. It will be understood that the lip 90 is not required.

Figure 12:
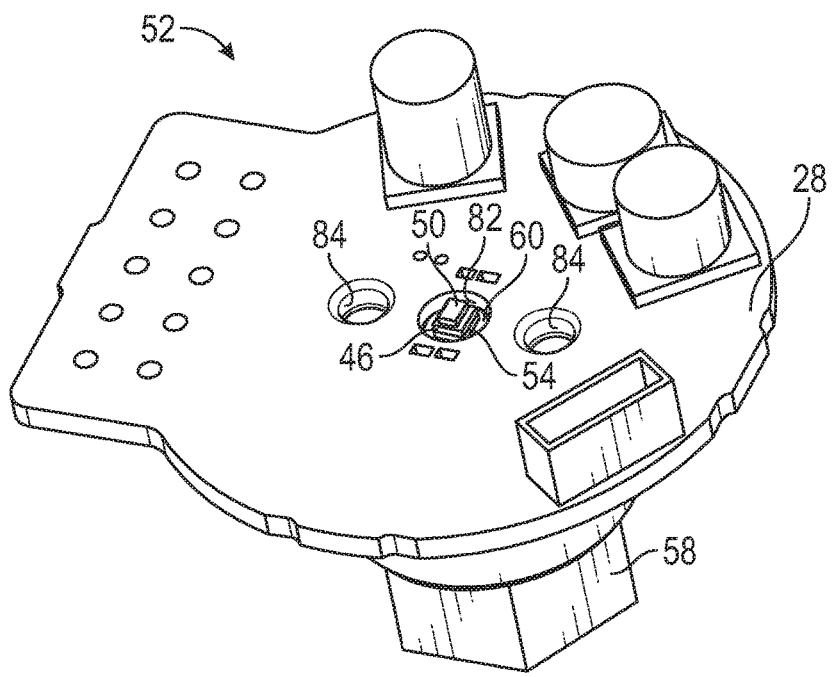
FIG. 12 is a perspective view of the portion of the SHC illustrated in FIGS. 1 and 2 showing the PCB attached thereto.

After mounting the pressure sensor die 46 to any of the fluid inlet members 40, 58, and 74, a PCB, such as the PCB 28 may then be mounted to the fluid inlet member 40, 58, and 74, as shown in FIGS. 6 and 12. The illustrated PCB 28 includes a die aperture 82 and two fastener apertures 84. The PCB 28 may be positioned on the fluid inlet member 40, 58, and 74 such that the pressure sensor die 46 extends through the die aperture 82 and may be attached to the fluid inlet members 40, 58, and 74 with fasteners, such as threaded fasteners 86 (see FIG. 6) that extend through the fastener apertures 84 and into threaded bores 88 formed in the fluid inlet members 40, 58, and 74.

The principle and mode of operation of this invention have been explained and illustrated in its preferred embodiment. However, it must be understood that this invention may be practiced otherwise than as specifically explained and illustrated without departing from its spirit or scope.

What is claimed is:

1. A method of attaching a MEMS die to a surface, the method comprising:
    placing solder mask having a centrally formed flow area on a solder surface of a body;
    centering and rotationally aligning a solder perform on the solder surface of the body within the flow area of the solder mask;
    centering and rotationally aligning a MEMS die on the solder preform; and
    heating the solder perform in a reflow process until the solder is molten and surface tension of the molten solder moves the MEMS die to a position where the surface tensions balance and the MEMS die is centered within the flow area of the solder mask;
    wherein the solder surface of the body is substantially circular and the solder preform is substantially rectangular.

2. The method of attaching a MEMS die to a surface according to claim 1, wherein the centrally formed flow area of the solder mask is substantially rectangular.

3. The method of attaching a MEMS die to a surface according to claim 1, wherein the solder perform has a hole formed centrally therethrough.

4. The method of attaching a MEMS die to a surface according to claim 3, further including positioning the solder perform within the flow area of the solder mask such that the peripheral edges of the solder preform are rotationally aligned with walls of the flow area of the solder mask.

* * * * *